(12) United States Patent
Rangavajjhala et al.

(10) Patent No.: US 7,796,062 B1
(45) Date of Patent: Sep. 14, 2010

(54) METHOD AND APPARATUS FOR PROVIDING NON-POWER-OF-TWO EVEN COUNT GRAY CODE

(75) Inventors: Venkata Rangavajjhala, Fremont, CA (US); Naveen K. Jain, San Jose, CA (US)

(73) Assignee: Tellabs San Jose, Inc., Naperville, IL (US)

( * ) Notice: Subject to any disclaimer, the term of this patent is extended or adjusted under 35 U.S.C. 154(b) by 373 days.

(21) Appl. No.: 11/874,077

(22) Filed: Oct. 17, 2007

(51) Int. Cl.
*H03M 7/16* (2006.01)
(52) U.S. Cl. .......................................... 341/96; 711/218
(58) Field of Classification Search ................... 341/96, 341/97, 98; 377/26, 33, 34; 711/217, 218, 711/219, 221
See application file for complete search history.

(56) References Cited

U.S. PATENT DOCUMENTS 6,314,154 B1   11/2001  Pontius
6,337,893 B1 * 1/2002 Pontius ........................ 377/108
6,762,701 B2 * 7/2004 Jiang .............................. 341/98
7,148,825 B2 * 12/2006 Jiang .............................. 341/97
2005/0024241 A1 * 2/2005 Oberai et al. ................... 341/98
2005/0258988 A1 * 11/2005 Jiang ............................. 341/97

* cited by examiner

*Primary Examiner*—Howard Williams
(74) *Attorney, Agent, or Firm*—James M. Wu; JW Law Group

(57) ABSTRACT

An apparatus and a method for enhancing digital processing implementation using non-power-of-two even count Gray coding are disclosed. The even count encoding device includes a first circuit, a second circuit, and a coding circuit. The first circuit, in one embodiment, is configured to identify a first portion of entries in a table in response to an input number. The second circuit is capable of determining a second portion of entries in the table in response to the input number, wherein the number of the first portion of entries and the number of the second portion of the entries are substantially the same. The coding circuit is operable to concatenate the second portion of the entries to the first portion of the entries to form an output table, which includes a sequence of even count integers wherein the difference between two adjacent integers is one bit position.

24 Claims, 5 Drawing Sheets

METHOD AND APPARATUS FOR PROVIDING NON-POWER-OF-TWO EVEN COUNT GRAY CODE

FIELD

The exemplary embodiment(s) of the present invention relates to data processing. More specifically, the exemplary embodiment(s) of the present invention relates to digital coding implementation.

BACKGROUND

Temporary data buffering using a first-in-first-out ("FIFO") or first-come-first-served ("FCFS") device is commonly deployed in a digital computational environment. Upon receipt of data, FIFO device typically stores the data at a FIFO address indicated by a write-pointer. After the data is stored, the write-pointer is incremented to the next address, which points to the next storage location. To read data stored in the FIFO device, the data is read at a storage location pointed by a read-pointer. After the data is read, the read-pointer is incremented thereby the next read from the next storage location is properly pointed. The read and write pointers of the FIFO are basically counters that count data transfers. The counters are typically counting devices that wrap to zero when a maximum count is reached. Conventional binary-code counters are commonly used as FIFO pointers. When the read and write pointers are both operating within the same clock domain, the FIFO is known as a 'synchronous' FIFO. When they are in different clock domains, the FIFO is known as an 'asynchronous' FIFO.

The 'full' condition of the FIFO should be known by the write logic in order to avoid overwriting an unread entry. Similarly, the 'empty' condition of the FIFO should be known by the read logic in order to avoid reading an invalid entry. A logical comparison between the write-pointer and the read-pointer can typically determine the fill level of the FIFO. This operation poses some complications in 'asynchronous' FIFOs.

Since the read and write pointers in an asynchronous FIFO are in two independent clock domains, a direct comparison of the pointers would yield incorrect results. It is essential for both pointers to be in the same clock domain for the comparison to yield correct results. Therefore, each pointer needs to be 'synchronized' to the other pointer's clock domain. 'Synchronization' is a process of transferring signals from a given clock domain to a different clock domain to minimize metastability (an electrical condition that sets the underlying transistors in the circuit in an unknown (neither logic '1' nor '0') state).

The first step in synchronizing a signal that is generated in one clock domain (domain A) to another clock domain (domain B) is to sample the value of the signal in the target clock domain (domain B). When a value involving multiple signals (like a multi-bit binary count value) is sampled, there is a high probability of sampling the wrong value since the different bits making up the value may be toggling at different times. For example, when a counter increments from 011=3 to 100=4, every bit position changes. Such bit position changes may take place at slightly different times across each bit positions.

A conventional approach to alleviate or to reduce multiple bits changing scenario is to use Gray code instead of Binary code. Gray code typically requires a change in one bit position for every increment. For example, a 3-bit Gray code sequence is follows: 0=000, 1=001, 2=011, 3=010, 4=110, 5=111, 6=101, and 7=100. As such, Gray code provides a solution to reduce the ambiguities confronting binary code during cross-clock synchronization.

A problem associated with a Gray code counter is that it tends to break down for non-power-of-two counts. For instance, if a count of 6 values (non-power-of-two) is required, the simple Gray code sequence would be 000–>001–>011–>010–>110–>111 with the last value rolling back to 000. This would break the Gray coding rule of only one bit changing between adjacent values. Variations to Gray code have been proposed that accommodate non-power-of-two counts, but tend to be complex and is not readily scalable. Restricting FIFO designs to depths that are a power-of-two could be wasteful in terms of the memory size used. If, for example, a communication application only requires a FIFO depth of 80, the power-of-two counter requires 128 bits to address FIFO's 80 storage locations. The excess capacity can be costly in terms of integrated-circuit area that might otherwise be devoted to other functions.

SUMMARY

An apparatus and method for enhancing digital processing implementation using non-power-of-two even count Gray coding are disclosed. An even count encoding device, in one embodiment, includes a first circuit, a second circuit, and a coding circuit. The first circuit uses a divide function to identify a first portion of entries in a table in response to an input number. The number of entries in the table is a closest power-of-two number to the input number. The second circuit determines a second portion of entries in the table in response to the input number. It should be noted that the number of the first portion of the entries and the number of the second portion of the entries are substantially the same. The encoding circuit concatenates the second portion of the entries to the first portion of the entries to form an output table. The output table includes a sequence of even count integers wherein the difference between two adjacent integers is one bit position.

Additional features and benefits of the exemplary embodiment(s) of the present invention will become apparent from the detailed description, figures and claims set forth below.

BRIEF DESCRIPTION OF THE DRAWINGS

The exemplary embodiment(s) of the present invention will be understood more fully from the detailed description given below and from the accompanying drawings of various embodiments of the invention, which, however, should not be taken to limit the invention to the specific embodiments, but are for explanation and understanding only.

DETAILED DESCRIPTION

Figure 1A:
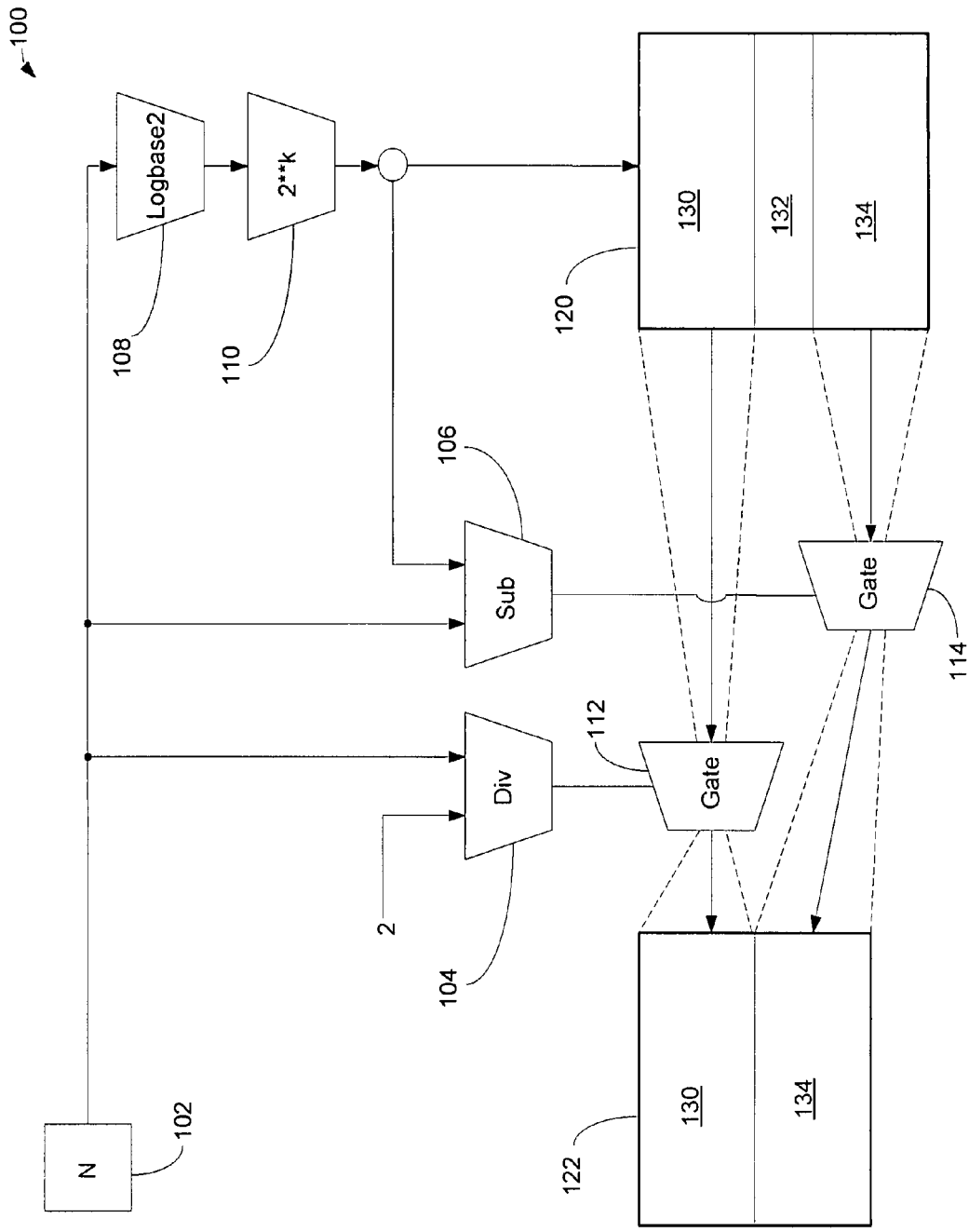
FIG. 1A is a logic block diagram illustrating a device capable of creating an even count integer table in accordance with one embodiment of the present invention.

Exemplary embodiment(s) of the present invention is described herein in the context of a method, device, and apparatus of enhancing digital processing implementation using non-power-of-two even count Gray coding.

Those of ordinary skilled in the art will realize that the following detailed description of the exemplary embodiment(s) is illustrative only and is not intended to be in any way limiting. Other embodiments will readily suggest themselves to such skilled persons having the benefit of this disclosure. Reference will now be made in detail to implementations of the exemplary embodiment(s) as illustrated in the accompanying drawings. The same reference indicators will be used throughout the drawings and the following detailed description to refer to the same or like parts.

In the interest of clarity, not all of the routine features of the implementations described herein are shown and described. It will, of course, be understood that in the development of any such actual implementation, numerous implementation-specific decisions may be made in order to achieve the developer's specific goals, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skilled in the art having the benefit of this disclosure.

In accordance with the embodiment(s) of the present invention, the components, process steps, and/or data structures described herein may be implemented using various types of operating systems, computing platforms, computer programs, and/or general purpose machines. In addition, those of ordinary skill in the art will recognize that devices of a less general purpose nature, such as hardwired devices, field programmable gate arrays (FPGAs), application specific integrated circuits (ASICs), or the like, may also be used without departing from the scope and spirit of the exemplary embodiment(s) of inventive concepts disclosed herein. Where a method comprising a series of process steps is implemented by a computer or a machine and those process steps can be stored as a series of instructions readable by the machine, they may be stored on a tangible medium such as a computer memory device (e.g., ROM (Read Only Memory), PROM (Programmable Read Only Memory), EEPROM (Electrically Erasable Programmable Read Only Memory), FLASH Memory, Jump Drive, and the like), magnetic storage medium (e.g., tape, magnetic disk drive, and the like), optical storage medium (e.g., CD-ROM, DVD-ROM, paper card and paper tape, and the like) and other known types of program memory.

A device capable of enhancing digital processing implementation using non-power-of-two even count Gray coding is disclosed. The device, also known as an even count encoding device, includes a first circuit, a second circuit, and a coding circuit. The first circuit, in one embodiment, is configured to perform a function of M=N÷2, wherein M is the number of first portion of the entries from a Gray code table and N is an even number, also known as an even input number. It should be noted that the number of entries in the Gray code table is the closest power-of-two number to the input number. For example, if the input number is 6, the closest power-of-two number ($2^3$) is 8.

The second circuit is capable of determining a second portion of the entries in the Gray code table in response to the input number. In one embodiment, the number of the first portion of the entries and the number of the second portion of the entries are substantially the same. To identify the second portion of the entries in the table, the second circuit also performs a skipping function of $X=2^K-N$, wherein X is a number of the entries to skip, or a number of skipping entries, wherein $2^K$ is the function to derive the closest power-of-two number with respect to the input number. The encoding circuit concatenates the second portion of the entries to the first portion of the entries to form an output table. The output table includes a sequence of even count integers, wherein the difference between two adjacent integers is one bit position.

FIG. 1A is a logic block diagram illustrating a device 100 capable of creating an even count integer table in accordance with one embodiment of the present invention. Device 100 includes an input number or N 102 and circuitries for generating a Gray code table in accordance with N 102. The number of entries in the Gray code table, for example, should be the closest power-of-two number with respect to N 102. Device 100 further includes other circuitries for converting the Gray code table to a non-power-of-two even count integer table. It should be noted that the underlying concept of the exemplary embodiment(s) of the present invention would not change if one or more blocks (circuit or circuitries) were added to or removed from device 100.

A function of device 100 is to generate a non-power-of-two sequence of even count integers wherein the difference between any two adjacent integers is one bit position. Power-of-two integers mean $2^1, 2^2, 2^3, 2^4 \ldots, 2^K$, in which the number such as 2, 4, 8, 16, 32, 64, 128, 265 . . . , can go up quickly. Also, one bit position difference between any two adjacent integers means the bit position change between two neighboring digits or integers including wrap around from the bottom entry to the top entry of a table is one bit position. The following table illustrates a Gray code, in which the difference between any two adjacent integers is one bit position.

| Binary code | Gray code |
|---|---|
| 000 | 000 |
| 001 | 001 |
| 010 | 011 |
| 011 | 010 |
| 100 | 110 |
| 101 | 111 |
| 110 | 101 |
| 111 | 100 |

While bit position in binary code may change multiple times for one increment such as from 011 to 100, the bit position in Gray code only changes one time for every increment. This is true even for the wrap around scenario in which the counter moves from the bottom of the table to the top of the table.

Input number or N 102, in one embodiment, indicates a desirable even number for a specific application, such as a FIFO counter. N 102 can be any even number which may be obtained from a storage location, user input, or an output from another logic device. Upon obtaining N 102, device 100, also known as an even count encoding device, performs a function of logarithm to base two 108, $k=\log_2(N)$ to derive an exponent number k. The exponent number k is fed to circuit 110 to define a closest power-of-two number with respect to N 102 using a function of $y=2^K$, wherein y is the closest power-of-two number. It should be noted that y is generally greater than N 102 since y is a function of k, and k is a function of N 102.

The closest power-of-two number y is subsequently used to generate a Gray code table 120 with y entries 130-134.

First circuit 104 of device 100 includes a divider or a multiplier and identifies a first half of entries 130 for an output table 122 by transferring a first portion of entries 130 from the Gray code table 120. The number of first half entries 130 can be derived from a function of M=N÷2, wherein M is the first half entries of the output table. The number M indicating the number of first half entries is used by circuit 112 to convert or transfer the first portion of the entries 130 from the Gray code table 120 to the first half entries of output table 122.

Device 100 also includes circuitries 106, 114 to identify the second half entries for the output table 122 after skipping or removing a set of skipping entries 132 in the Gray code table 120. The skipping entries 132, in one embodiment, are identified by subtracting N 102 from the closest power-of-two number, or a function of $X=2^K-N$, wherein X is the skipping entries 132. Circuit 114 identifies the remaining entries or the second portion of entries 134 from the Gray code table 120 in response to skipping entries 132. The second portion of entries 134 is subsequently transferred to the output table 122 as the second half entries. It should be noted that skipping entries 132 are usually located in the middle of the Gray code table 120. It should be further noted that the number of the first portion of entries 130 and number of the second portion of entries 134 should be the same or substantially the same.

Once the first portion and the second portion of the entries 130 and 134 are determined, an encoding circuit, in one embodiment, concatenates the second portion of the entries 134 to the first portion of the entries 130 to form the output table 122. It should be noted that the entries of output table 122 includes a sequence of even count integers wherein the difference between any two adjacent integers in the output table 122 is one bit position. Since the input number N 102 is an even number, the total number of entries in the output table 122 equals to N 102. It should be noted that the output table 122 contains a sequence of non-power-of-two even count integers, also known as a non-power-of-two even count Gray code.

Figure 1B:
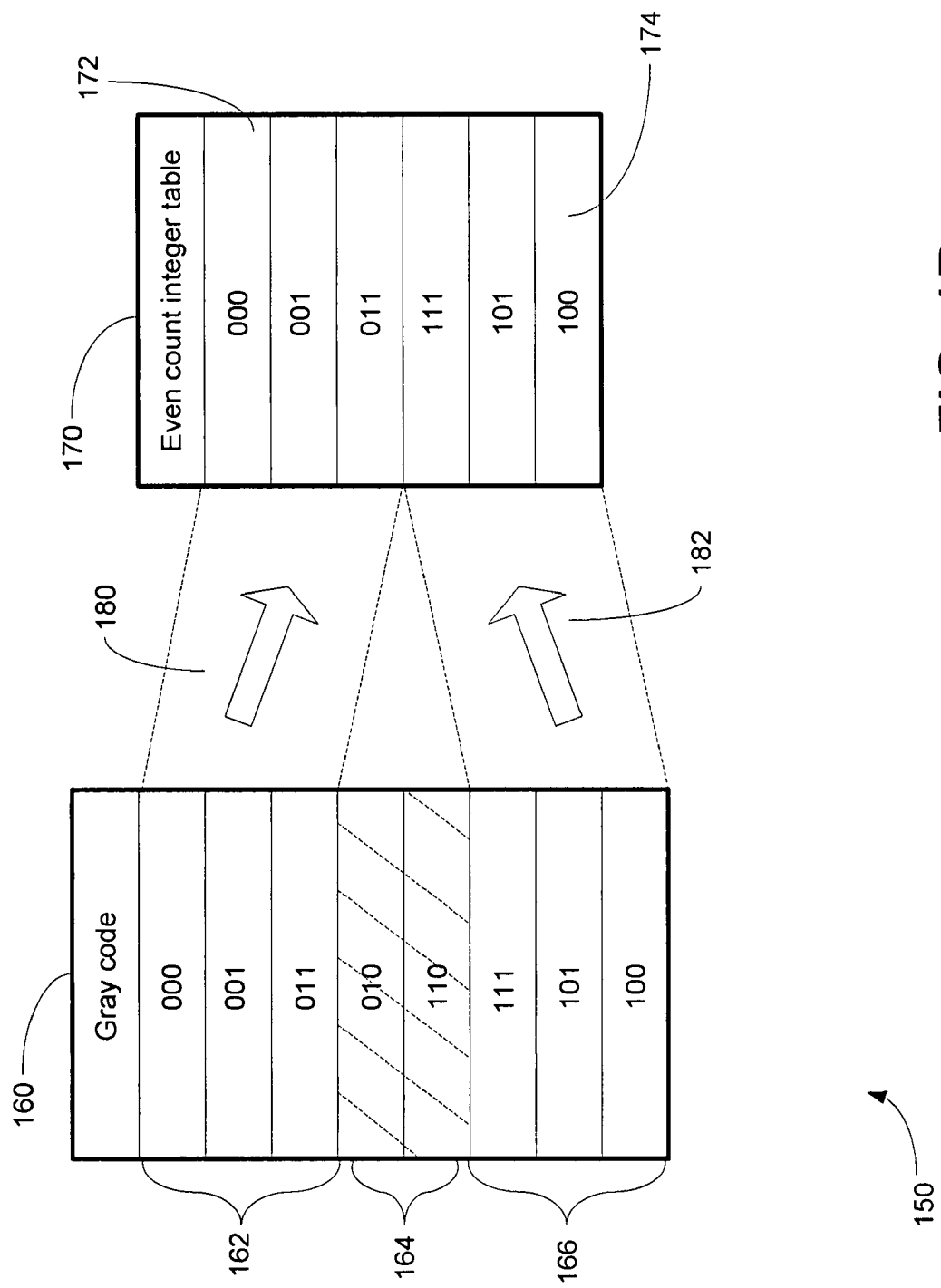
FIG. 1B is a block diagram illustrating an example of converting a Gray code table to an even count integer table in accordance with one embodiment of the present invention.

FIG. 1B is a block diagram 150 illustrating an example of converting a Gray code table 160 to an even count integer table 170 in accordance with one embodiment of the present invention. This example is based upon an assumption that a desirable input number N is 6, wherein N 102 may be stored in a memory, not shown in FIG. 1B, or entered by a user or machine. When N 102, which may be used to indicate the total bit number needed for an FIFO counter, is 6, the closest power-of-two number should be 8 since the closest power-of-two number is derived from $2^K$, wherein k is derived from k=$\log_2$ (N). As such, Gary code table 160 with 8 entries is formed, as shown in FIG. 1B. The first portion of the entries 162 includes three entries since the number of the first portion is derived from M=N÷2, wherein M is the number of the first portion. Since the number of skipping entries 164 is 2, which is derived from $X=2^3-6$, the second portion of the entries 166 is three entries, which are the remaining entries in the Gray code table 160 after subtracting the first portion of the entries 162 and skipping entries 164 from the total numbers of the entries.

The first portion 162 and the second portion 166 are subsequently transferred to even count integer table 170 via connections 180-182. Even count integer table 170 is a non-power-of-two sequence of integers wherein the difference between any two adjacent or neighboring integers is one bit position. It should be noted that the bit position difference between integer (000) at the first entry 172 and the integer (100) at the last entry 174 of even count integer table 170 is one bit. It should be further noted that the non-power-of-two even count Gray code is applicable to various applications beyond 3-bit as shown above.

Figure 2:
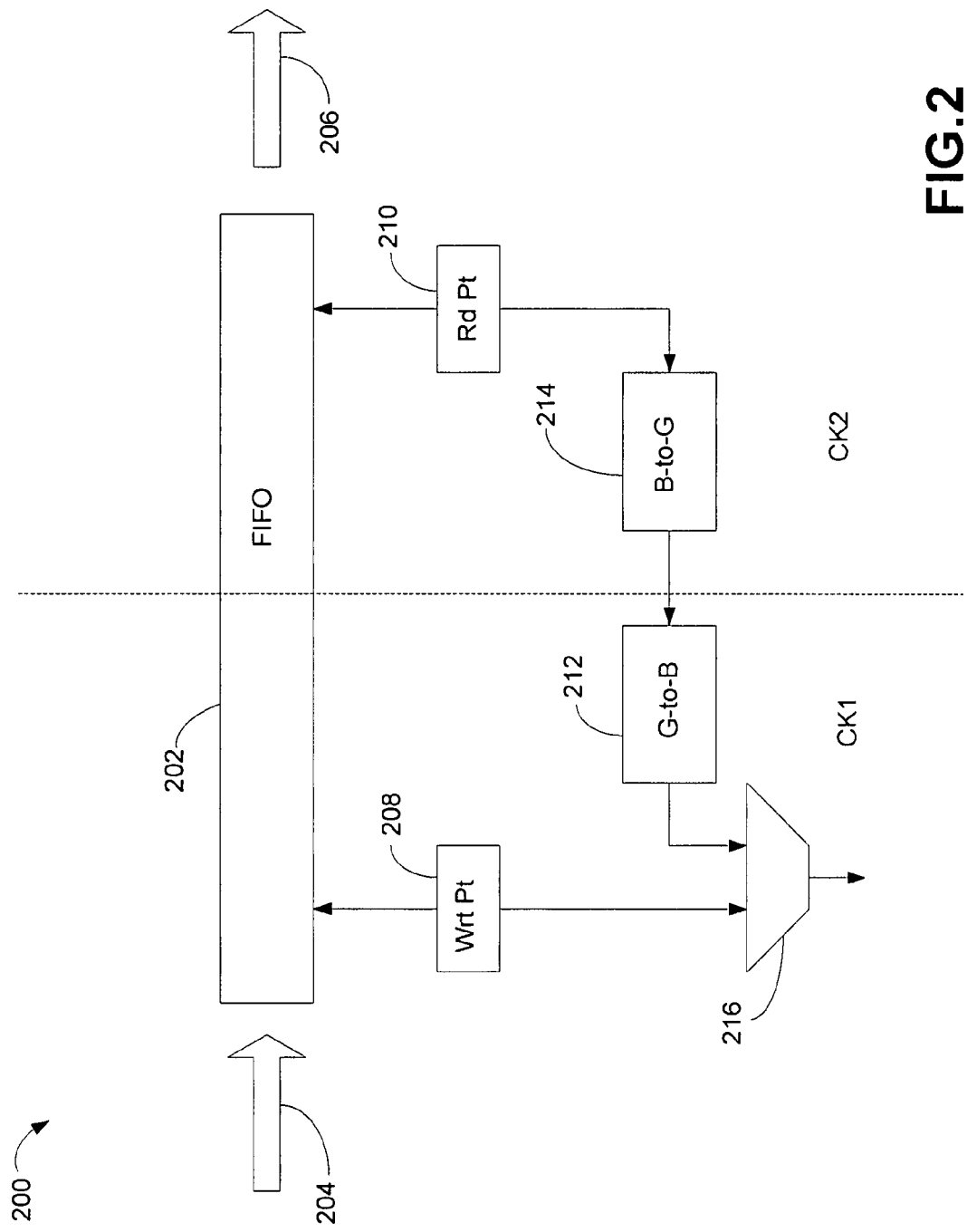
FIG. 2 is a block diagram illustrating a first-in first-out ("FIFO") device situated in a multiple clock domains in accordance with one embodiment of the present invention.

FIG. 2 is a block diagram 200 illustrating a first-in first-out ("FIFO") buffer 202 situated in multiple clock domains in accordance with one embodiment of the present invention. FIFO 202 includes a write-pointer 208, a read-pointer 210, a binary-to-Gray code converter 214, and a Gray-to-binary code converter 212, and compare logic 216. FIFO 202 receives data for temporally storage via connection 204 in a first clock domain, and reads or pops stored data via connection 206 in a second clock domain. In one embodiment, the first clock domain and the second clock domain are different clock cycles or frequencies. It should be noted that the underlying concept of the exemplary embodiment(s) of the present invention would not change if one or more circuitries were added to or removed from diagram 200.

To determine whether FIFO 202 is empty or somewhat empty or full, compare logic 216 needs to perform a comparison task between the values of write-pointer 208 and read-pointer 210. The difference between read-pointer 210 and write-pointer 208 indicates the current capacity of FIFO 202. For example, if the difference between read-pointer 210 and write-pointer 208 is zero, it indicates that FIFO 202 is full. Referring back to FIG. 2, since read-pointer 210 and write-pointer 208 operate at the different clock domains, circuitries 214 is used to convert read-pointer 210 in binary code to read-pointer in non-power-of-two even count Gray code. When the value of read-pointer 210 is coded in the non-power-of-two even count gray code, it provides better data integrity than the values in binary code since integers coded in non-power-of-two even count Gray code only changes one bit position for each increment.

After crossing the clock domain boundary from CK2 to CK1, the value of read-pointer 210 coded in non-power-of-two even count Gray code is converted back to binary code by circuit 212. Once the conversion is performed, compare logic 216 compares the values from write-pointer 208 and read-pointer 210 to identify whether FIFO 202 is full or empty or somewhat empty. It should be noted that the exemplary embodiment(s) of the present invention provides a mechanism to scale Gray code to non-power-of-two even count Gray code.

Figure 3:
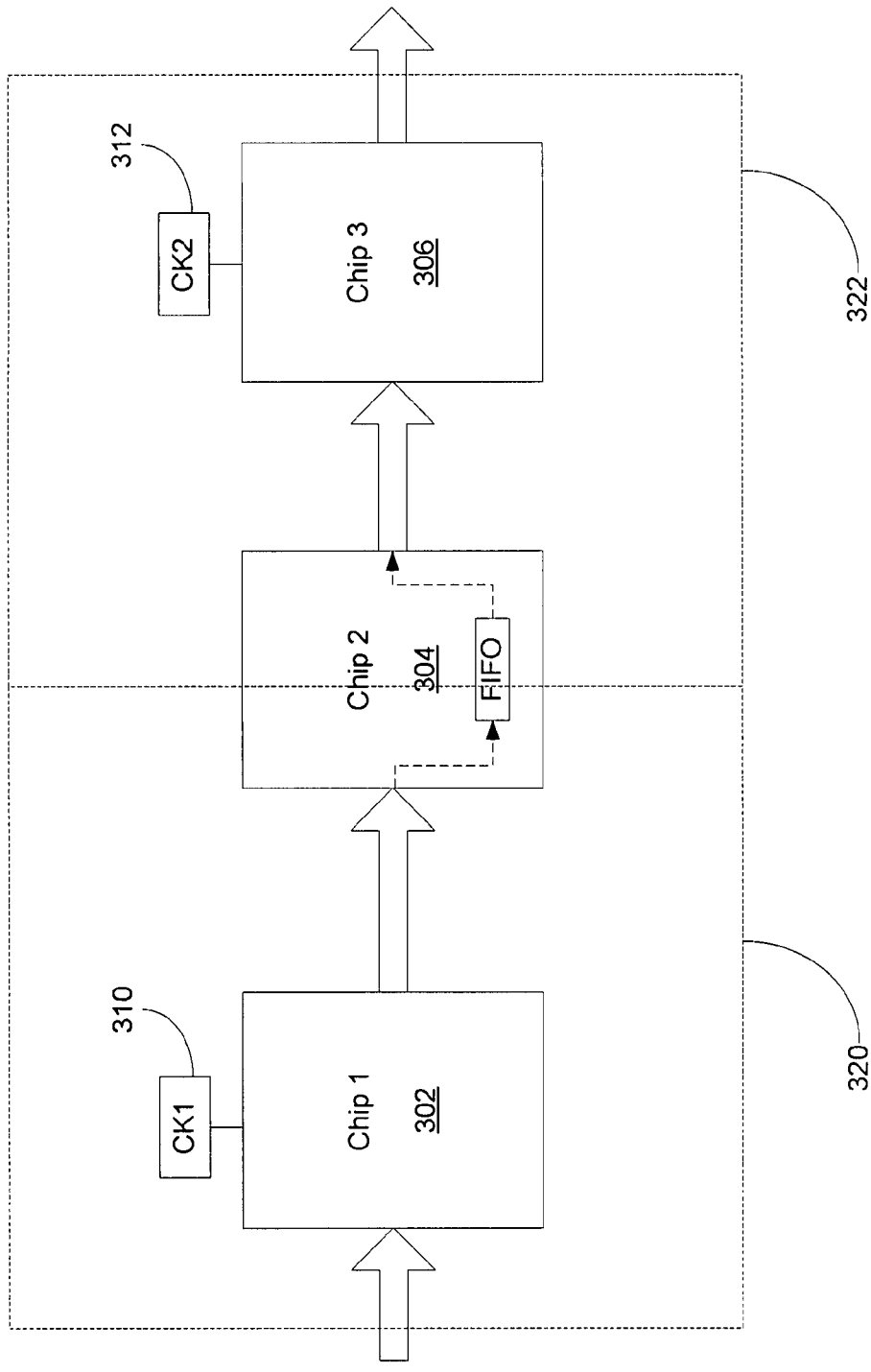
FIG. 3 is a block diagram illustrating multiple chips using multiple clock domains in accordance with one embodiment of the present invention.

FIG. 3 is a block diagram 300 illustrating multiple chips 302-306 using multiple clock domains 320-322 in accordance with one embodiment of the present invention. In this example, chip 1 operates at a clock domain CK1 310 while chip 3 operates at a clock domain CK2 312 wherein CK1 and CK2 are different clock frequencies. When the output of chip 1 is fed to the input of chip 2 and the output of chip 2 is fed to the input of chip 3, the mechanism of using non-power-of-two even count Gray code may be used in at least a portion of the FIFO implementation in chip 2 to enhance data integrity. It should be noted that a sequence of integers coded in non-power-of-two even count Gray code is applicable to any types of chip sets as well as network communications.

The exemplary embodiment of the present invention includes various processing steps, which will be described below. The steps of the embodiment may be embodied in machine or computer executable instructions. The instructions can be used to cause a general purpose or special purpose system, which is programmed with the instructions, to perform the steps of the exemplary embodiment of the present invention. Alternatively, the steps of the exemplary embodiment of the present invention may be performed by specific hardware components that contain hard-wired logic for performing the steps, or by any combination of programmed computer components and custom hardware components. While embodiments of the present invention will be described with reference to the Internet, the method and apparatus described herein are equally applicable to other network infrastructures or other data communications environments.

Figure 4:
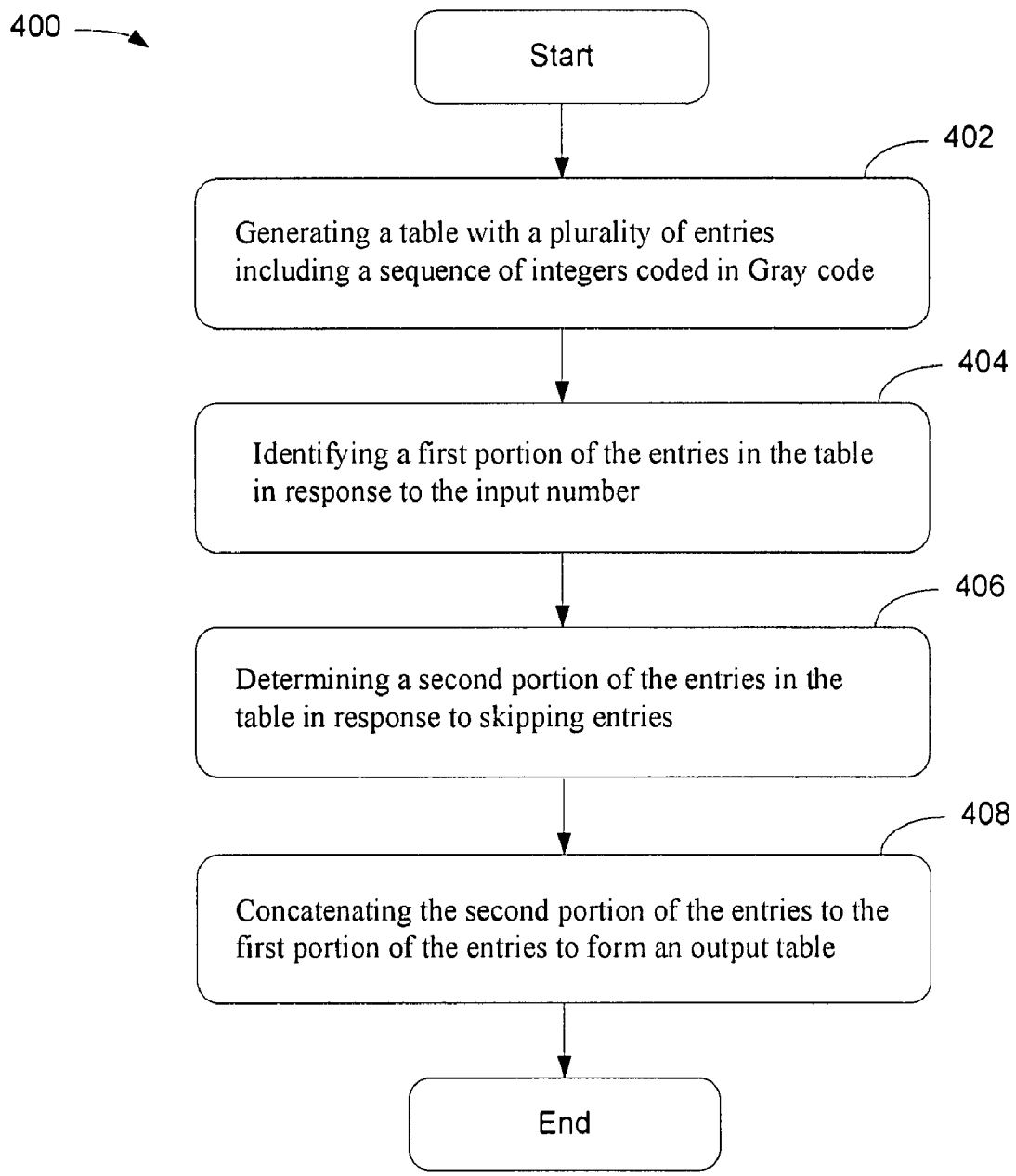
FIG. 4 is a flowchart illustrating a process of generating an output table having a sequence of even count table in accordance with one embodiment of the present invention.

FIG. 4 is a flowchart 400 illustrating a computing process for generating an output table having a sequence of non-power-of-two Gray code integers in accordance with one embodiment of the present invention. At block 402, a process for providing a sequence of integers in non-power-of-two even count Gray code generates a table with multiple entries. The table includes a sequence of integers coded in Gray code. The number of entries for the table is created in accordance with a closest power-of-two number regarding to the input number. In one embodiment, the input number is retrieved from a storage location. Alternatively, the input number is entered by a user or a logic device. The process further performs a logarithm to base two of the input number to obtain an exponent number. The exponent number is subsequently used to form the table with entries that equals to the exponent number of two-based power. It should be noted that the closest power-of-two number is greater than the input number. After block 402, the process proceeds to the next block.

At block 404, the process identifies a first portion of the entries in the table in response to the input number. In one embodiment, the process divides the input number by 2 to obtain a first entry number, which is used to identify the first half entries of the output table by transferring the first portion of the entries from the table to the output table. After block 404, the process proceeds to the next block.

At block 406, the process determines a second portion of the entries in the table in response to skipping entries. It should be noted that the first portion of the entries and the second portion of the entries are the same or substantially the same. The process, in one embodiment, subtracts the input number from the closest power-of-two number to determine how many entry or entries need to skip. It should be noted that the skipping entries are located in the middle or substantially middle portion of the table. After block 406, the process moves to the next block.

At block 408, the process concatenates the second portion of the entries to the first portion of the entries from the table to form the output table. The process, in one embodiment, generates the output table with the number entries that is equal to the input number. The process transfers or enters a digital integer in an entry of the output table wherein the difference between every two adjacent integers is one bit position. After block 408, the process ends.

While particular embodiments of the present invention have been shown and described, it will be obvious to those skilled in the art that, based upon the teachings herein, changes and modifications may be made without departing from this exemplary embodiment(s) of the present invention and its broader aspects. Therefore, the appended claims are intended to encompass within their scope all such changes and modifications as are within the true spirit and scope of this exemplary embodiment(s) of the present invention.

What is claimed is:

1. A device comprising:
a first circuit configured to identify a first portion of entries in a table in response to an input number, wherein number of entries in the table is a closest power-of-two number regarding to the input number;
a second circuit coupled to the first circuit, and configured to determine a second portion of entries in the table in response to the input number;
a coding circuit coupled to the second circuit, and operable to concatenate the second portion of the entries to the first portion of the entries to form an output table, wherein the output table includes a sequence of even count integers, wherein a difference between two adjacent integers stored in the output table is one bit position; and
a counter coupled to the coding circuit and capable of adjusting its value in response to the output table.

2. The device of claim 1, wherein the entries of the table include a sequence of integers in which a difference between two adjacent integers is one bit position.

3. The device of claim 2, wherein the sequence of integers stored in the output table is utilized for counter increment.

4. The device of claim 1,
wherein number of entries of the output table is substantially same to the input number; and
wherein the entries of the output table include a sequence of integers, in which a difference between two integers stored in adjacent entries of the output table is one bit position.

5. The device of claim 1, wherein the first circuit divides the input number by 2 to identify a first half entries of the output table.

6. The device of claim 1,
wherein the second circuit subtracts the input number from the closest power-of-two number to determine number of entries to skip in the table; and
wherein the coding circuit identifies a second half entries of the output table in response to the number of entries to skip.

7. The device of claim 1, wherein the input number is an even number; and wherein the output table includes a sequence of even count integers, in which a difference between two adjacent integers is one bit position.

8. A first-in-first-out (FIFO) connecting to multiple clock domains comprising the device of claim 1.

9. A method of providing an even count sequence of integers, comprising:
generating a table with a plurality of entries storing a sequence of integers coded in Gray code, wherein generating a table with a plurality of entries includes creating number of entries in accordance with a closest power-of-two number regarding to an input number;
identifying a first portion of the entries in the table in response to the input number;
determining a second portion of the entries in the table in by skipping one or more entries of the table, wherein number of the first portion of the entries and the second portion of the entries is substantially same;
concatenating the second portion of the entries to the first portion of the entries from the table to form an output table; and
increasing a count value in response to integers stored in the output table.

10. The method of claim 9, further includes retrieving the input number stored in a storage location.

11. The method of claim 9, wherein generating a table with a plurality of entries includes performing a logarithm to base two of the input number to obtain an exponent number.

12. The method of claim 11, wherein performing logarithm to base two of the input number further includes forming the table with entries that equals to the exponent number of two-based power.

13. The method of claim 9, wherein generating a table with a plurality of entries further includes generating the closest power-of-two number that is greater than the input number.

14. The method of claim 9, wherein identifying a first portion of the entries in the table includes dividing the input number by 2 to obtain a first half entries of the output table.

15. The method of claim 9, wherein determining a second portion of the entries in the table in response to skipping entries further includes subtracting the input number from the closest power-of-two number to determine number of entries to skip in the table.

16. The method of claim 9, wherein concatenating the second portion of the entries to the first portion of the entries further includes, generating the output table having number of entries that is equal to the input number; and encoding a sequence of integers in the output table wherein a difference between two adjacent integers in the output table is one bit position.

17. An apparatus of providing an even count sequence of integers, comprising:

means for generating a table with a plurality of entries storing a sequence of integers, wherein means for generating a table with a plurality of entries includes means for creating number of entries in accordance with a closest power-of-two number regarding to an input number;

means for identifying a first portion of the entries in the table in response to the input number;

means for determining a second portion of the entries in the table to by skipping one or more entries of the table, wherein number of the first portion of the entries and the second portion of the entries is substantially same;

means for concatenating the second portion of the entries to the first portion of the entries from the table to form an output table; and means for increasing a count value in response to integers stored in the output table.

18. The apparatus of claim 17, further includes means for retrieving the input number stored in a storage location.

19. The apparatus of claim 17, wherein means for generating a table with a plurality of entries includes means for performing a logarithm to base two of the input number to obtain an exponent number.

20. The apparatus of claim 19, wherein means for performing a logarithm to base two of the input number further includes means for forming the table with entries that equals to the exponent number of two-based power.

21. The apparatus of claim 17, wherein means for generating a table with a plurality of entries further includes means for generating the closest power-of-two number that is greater than the input number.

22. The apparatus of claim 17, wherein means for identifying a first portion of the entries in the table includes means for dividing the input number by 2 to obtain a first half entries of the output table.

23. The apparatus of claim 17, wherein means for determining a second portion of the entries in the table in response to skipping entries further includes means for subtracting the input number from the closest power-of-two number to determine number of entries to skip in the table.

24. The apparatus of claim 17, wherein means for concatenating the second portion of the entries to the first portion of the entries further includes, means for generating the output table having number of entries that is equal to the input number; and means for encoding a sequence of integers in the output table wherein a difference between two adjacent integers in the output table is one bit position.

* * * * *

UNITED STATES PATENT AND TRADEMARK OFFICE
CERTIFICATE OF CORRECTION

PATENT NO. : 7,796,062 B1  
APPLICATION NO. : 11/874077  
DATED : September 14, 2010  
INVENTOR(S) : Venkata Rangavajjhala and Naveen K. Jain Page 1 of 1

It is certified that error appears in the above-identified patent and that said Letters Patent is hereby corrected as shown below:

Claim 9, (Column 8) line 47, delete the word "in".

Claim 17, (Column 9) line 29, delete the word "to".

Signed and Sealed this
Twenty-sixth Day of April, 2011

David J. Kappos
*Director of the United States Patent and Trademark Office*